(12) United States Patent
Chen et al.

(10) Patent No.: US 12,279,397 B2
(45) Date of Patent: Apr. 15, 2025

(54) COLD PLATE

(71) Applicant: AURAS TECHNOLOGY CO., LTD., New Taipei (TW)

(72) Inventors: Yi-Wun Chen, New Taipei (TW); Ming-Yuan Chiang, New Taipei (TW); Chien-Yu Chen, New Taipei (TW); Mu-Shu Fan, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 374 days.

(21) Appl. No.: 17/892,357

(22) Filed: Aug. 22, 2022

(65) Prior Publication Data

US 2023/0111086 A1  Apr. 13, 2023

Related U.S. Application Data

(60) Provisional application No. 63/253,600, filed on Oct. 8, 2021.

(51) Int. Cl.
*H05K 7/20* (2006.01)
(52) U.S. Cl.
CPC ..... *H05K 7/20254* (2013.01); *H05K 7/20272* (2013.01); *H05K 7/2039* (2013.01)

(58) Field of Classification Search
CPC .......... H05K 7/20254; H05K 7/20272; H05K 7/2039; F28F 2250/08
See application file for complete search history.

(56) References Cited

U.S. PATENT DOCUMENTS

| 2018/0098458 A1* | 4/2018 | Chainer | H05K 7/20254 |
| 2021/0178029 A1* | 6/2021 | Kelbie | A61M 1/962 |
| 2022/0373275 A1* | 11/2022 | Mostafavi Yazdi | F28F 9/0246 |

* cited by examiner

*Primary Examiner* — Henry T Crenshaw
*Assistant Examiner* — Kamran Tavakoldavani
(74) *Attorney, Agent, or Firm* — Amin, Turocy & Watson, LLP (57) ABSTRACT

A cold plate is provided and includes: a casing formed with an accommodating groove; a base coupled to the casing to define an action space together with the casing, where the action space communicates with the accommodating groove; a heat transfer structure disposed on an inner side of the base for transferring a heat energy generated by a heat source in contact with an outer side of the base to a working medium in the action space; and a pump having a stator disposed in the accommodating groove.

12 Claims, 10 Drawing Sheets

COLD PLATE

BACKGROUND

1. Technical Field

The present disclosure relates to a heat dissipation field, and more particularly, to a cold plate.

2. Description of Related Art

In response to modern demands, computers and various electronic devices have developed rapidly and their performance has been continuously improved, but in the process, the problem of heat dissipation brought about by high-performance hardware also ensues. Generally speaking, computers and various electronic devices usually use heat dissipation elements to dissipate heat. For example, a thermal paste or a heat sink is used to attach to the electronic elements to be dissipated, so as to absorb and dissipate the heat. However, the effect of this heat dissipation method is limited, so a heat dissipation module using a liquid cooling method has been developed.

The existing heat dissipation modules using the liquid cooling method generally use cooling liquid to absorb heat energy. For example, the cooling liquid is connected to the electronic elements to be dissipated, and the heated cooling liquid can flow to a lower temperature for heat exchange. After the heat exchange, the cooling liquid can flow to the electronic elements to be dissipated again to absorb heat energy. Therefore, a heat dissipation cycle is formed. However, the existing heat dissipation module still has the problem that the temperature of the pump is too high during operation, and the pump cannot absorb water, which will lead to poor overall heat dissipation performance.

Therefore, how to provide a cold plate that can solve the above problems of the prior art is one of the urgent issues to be solved in the current industry.

SUMMARY

The present disclosure provides a cold plate, comprising: a casing formed with an accommodating groove on a bottom side thereof; a base coupled to the bottom side of the casing to define an action space together with the casing, wherein the action space communicates with the accommodating groove; a heat transfer structure disposed on an inner side of the base for transferring a heat energy generated by a heat source in contact with an outer side of the base to a working medium in the action space; and a pump having a stator disposed in the accommodating groove.

In the aforementioned cold plate, the cold plate further comprises an upper cover coupled to a top side of the casing to define a water collecting chamber together with the casing.

In the aforementioned cold plate, the top side of the casing is formed with a drainage groove, wherein the drainage groove is communicated with the water collecting chamber, and a position of the drainage groove corresponds to a position of the accommodating groove, and wherein the pump further has a rotor disposed in the drainage groove.

In the aforementioned cold plate, the casing further has at least one guide channel, wherein the guide channel penetrates through the top side and the bottom side of the casing and is spaced from the accommodating groove or the drainage groove to communicate with the water collecting chamber and the action space.

In the aforementioned cold plate, a number of the guide channels is two, and one of the guide channels is located above the heat transfer structure.

In the aforementioned cold plate, the casing further has a water inlet channel communicating with the action space and a water outlet channel communicating with the drainage groove.

In the aforementioned cold plate, a bottom of the drainage groove has an opening communicating with the action space.

In the aforementioned cold plate, the rotor has a body, a bottom plate and a magnetic element, wherein the bottom plate is disposed on one end of the body and located at a top of the drainage groove, and wherein the magnetic element is sleeved on the body and located between the bottom plate and a bottom of the drainage groove.

In the aforementioned cold plate, the cold plate further comprises a partition plate disposed between the casing and the base to partition the action space into a water storage space and a heat absorption space, wherein the partition plate and the casing jointly define a connecting channel communicating with the water storage space and the heat absorption space.

In the aforementioned cold plate, the heat transfer structure is a plurality of fins located in the heat absorption space, wherein the partition plate is abutted against tops of the plurality of fins.

In the aforementioned cold plate, the heat transfer structure is located under the partition plate and the pump at a same time, and a height of the heat transfer structure located under the pump is lower than a height of the heat transfer structure located under the partition plate.

In the aforementioned cold plate, the stator is in contact with the working medium.

In the aforementioned cold plate, a surface of the stator is coated with a protection layer.

In the aforementioned cold plate, a material of the protection layer includes an epoxy resin, an electroless nickel, or an ultraviolet curable adhesive.

DETAILED DESCRIPTIONS

The following describes the implementation of the present disclosure with examples. Those skilled in the art can easily understand the other advantages and effects of the present disclosure from the content disclosed in this specification, and can implement or apply the present disclosure according to other examples.

The cold plate provided by the present disclosure can be installed in electronic devices such as a computer host or a server, and the cold plate can be filled with a working medium (such as cooling liquid) therein, and the working medium can absorb the heat energy generated by the heat source (such as electronic elements such as chips or memory). The heated working medium can be sent to a condensing device for cooling, and the cooled working medium can be sent back to the cold plate for the next heat absorption and circulation flow.

Figure 6:
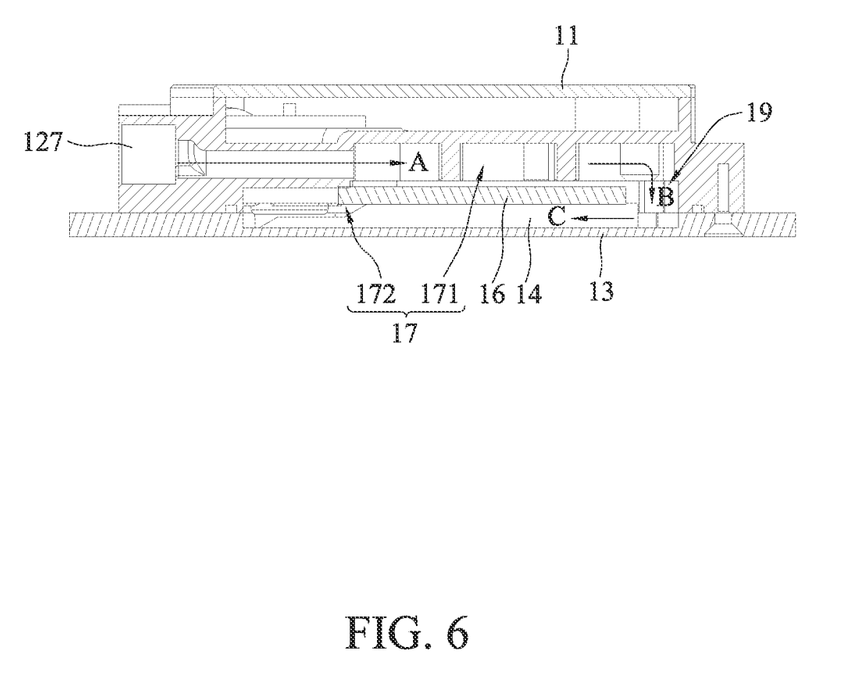
FIG. 6 is a schematic cross-sectional view of FIG. 1 along the line B-B.

Please refer to FIG. 1 to FIG. 4, the cold plate 1 of the present disclosure includes an upper cover 11, a casing 12, a base 13, a heat transfer structure 14, a pump 15 and a partition plate 16. The casing 12 has a top side 121 (shown in FIG. 3) and a bottom side 122 (shown in FIG. 4) opposite to each other, and the upper cover 11 is coupled to the top side 121 of the casing 12 to define a water collecting chamber 18 together with the casing 12. The top side 121 of the casing 12 is formed with a drainage groove 124 which communicates with the water collecting chamber 18. An accommodating groove 123 is formed on the bottom side 122 of the casing 12, and the position of the accommodating groove 123 corresponds to the position of the drainage groove 124. For instance, the drainage groove 124 is in the shape of a cone, while the accommodating groove 123 is in the shape of a ring, and the center of the drainage groove 124 and the center of the accommodating groove 123 are substantially coaxial. The base 13 is coupled to the bottom side 122 of the casing 12 to define an action space 17 together with the casing 12, and the accommodating groove 123 communicates with the action space 17 (as shown in FIG. 6).

Figure 1:
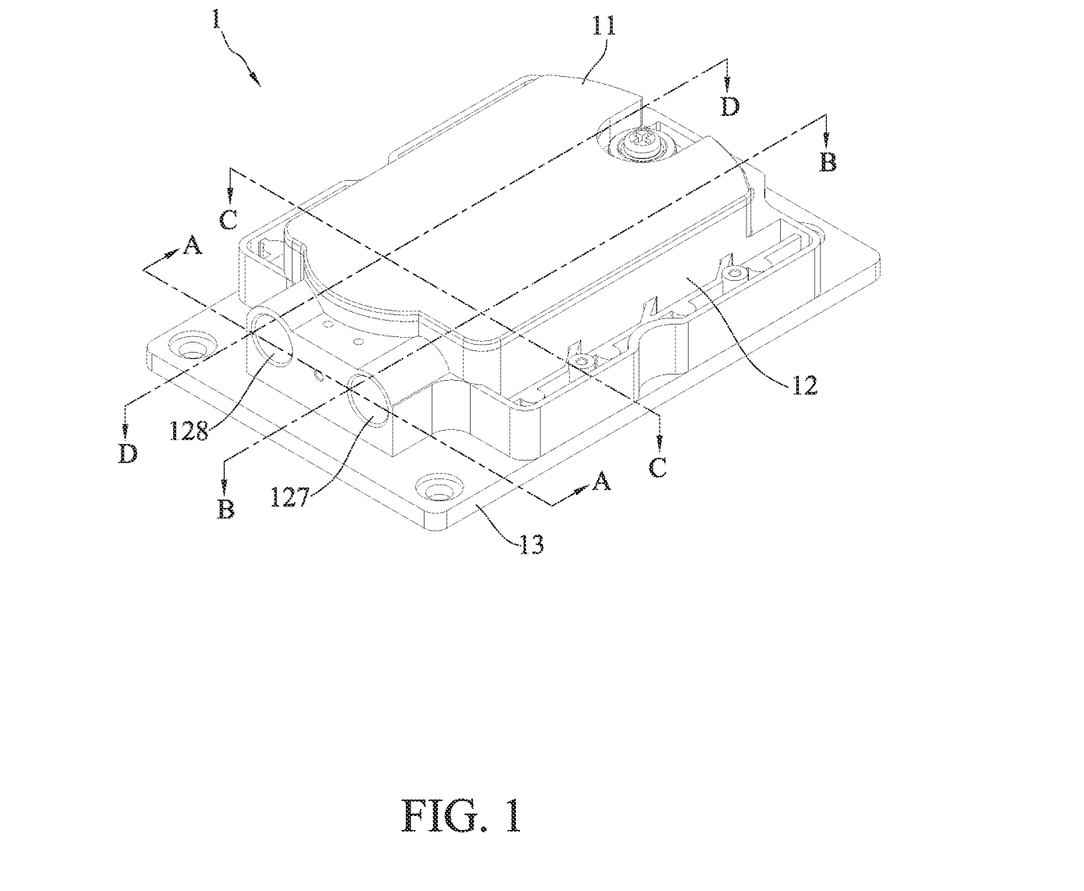
FIG. 1 is a schematic overall view of a cold plate according to the present disclosure.
Figure 2:
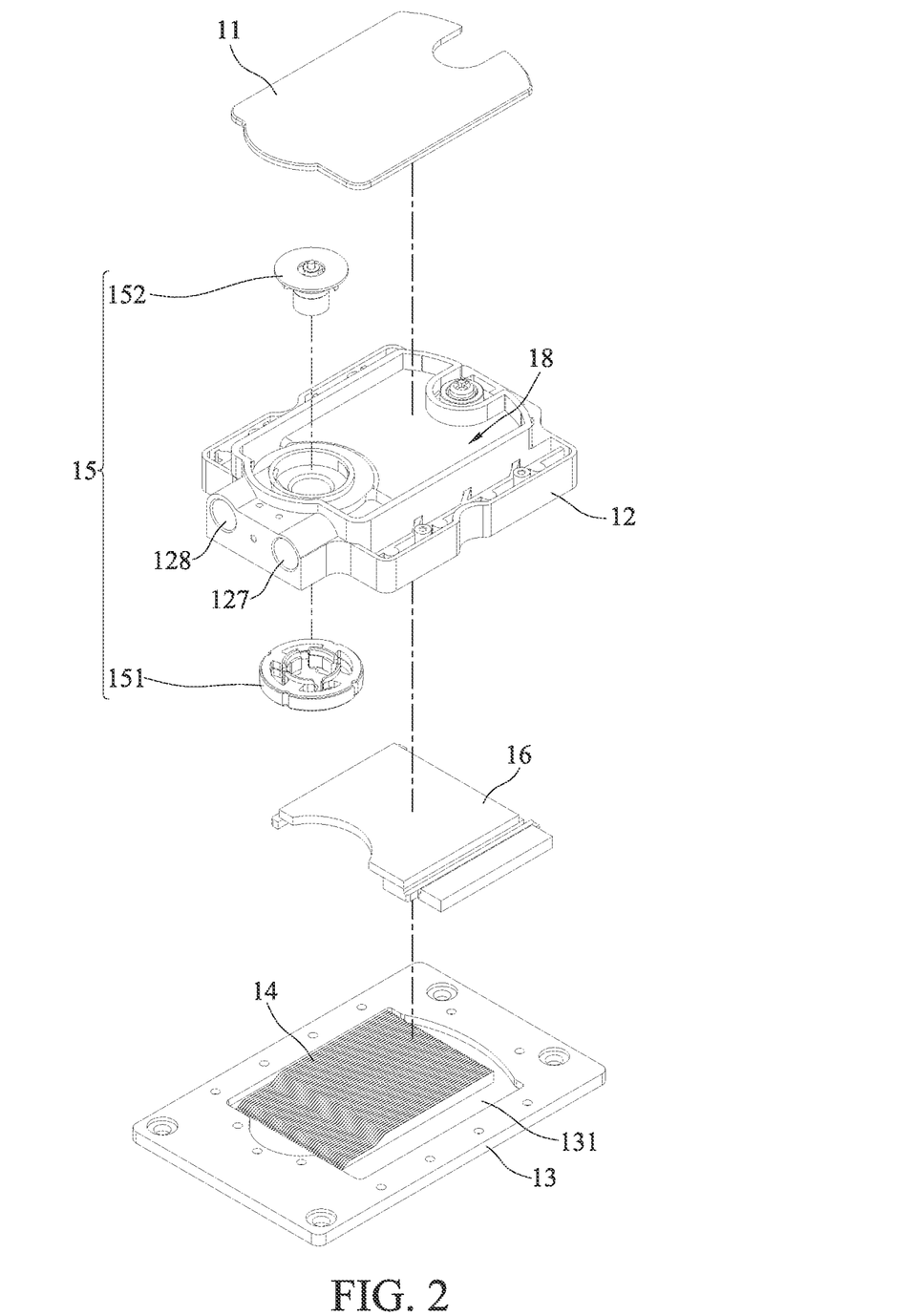
FIG. 2 is a schematic exploded view of the cold plate according to the present disclosure.
Figure 3:
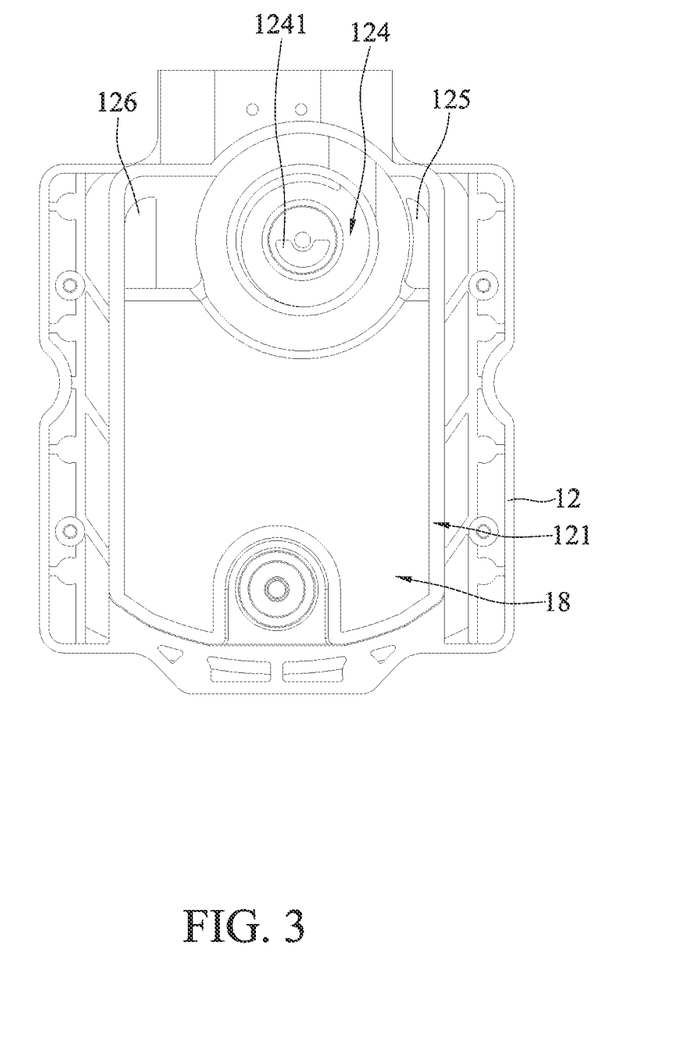
FIG. 3 is a schematic top view of a casing in the cold plate according to the present disclosure.
Figure 4:
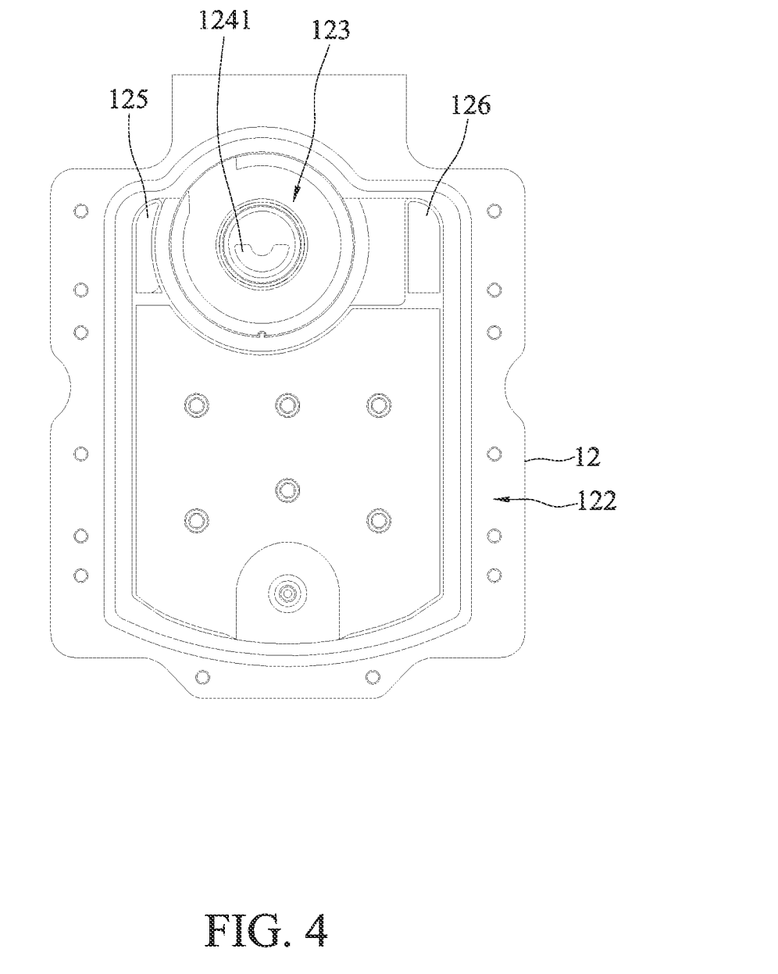
FIG. 4 is a schematic bottom view of the casing in the cold plate according to the present disclosure.
Figure 5:
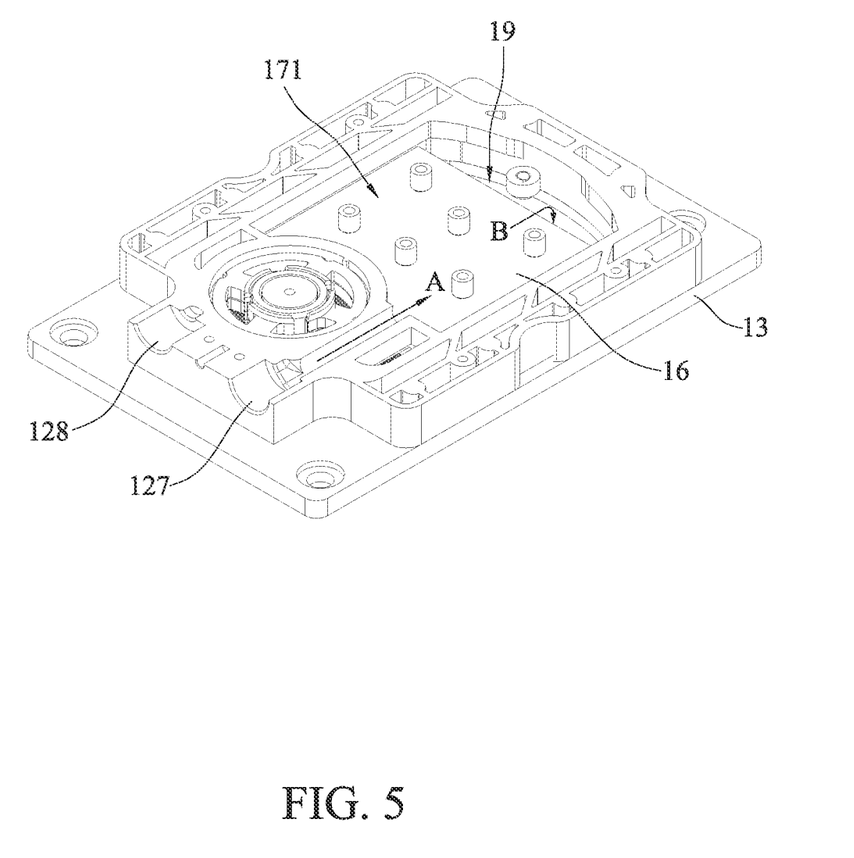
FIG. 5 is a schematic cross-sectional view of FIG. 1 along the line A-A.

The casing 12 further has two guide channels 125 and 126, a water inlet channel 127 and a water outlet channel 128. The guide channels 125 and 126 penetrate through the top side 121 and the bottom side 122 of the casing 12 and are spaced apart from the accommodating groove 123 or the drainage groove 124 for communicating with the action space 17 and the water collecting chamber 18. The water inlet channel 127 and the water outlet channel 128 are formed on the same side of the casing 12, but may also be formed on different sides. The water inlet channel 127 communicates with the action space 17, and the water outlet channel 128 communicates with the drainage groove 124. In addition, the bottom of the drainage groove 124 may further have an opening 1241 which can communicate with the action space 17.

Figure 7:
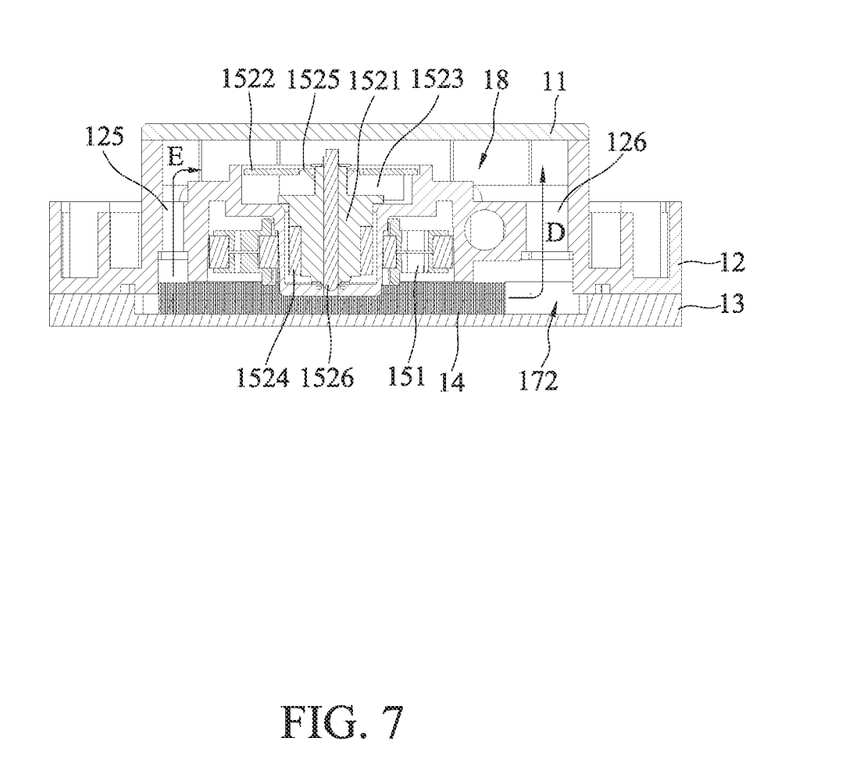
FIG. 7 is a schematic cross-sectional view of FIG. 1 along the line C-C.
Figure 8:
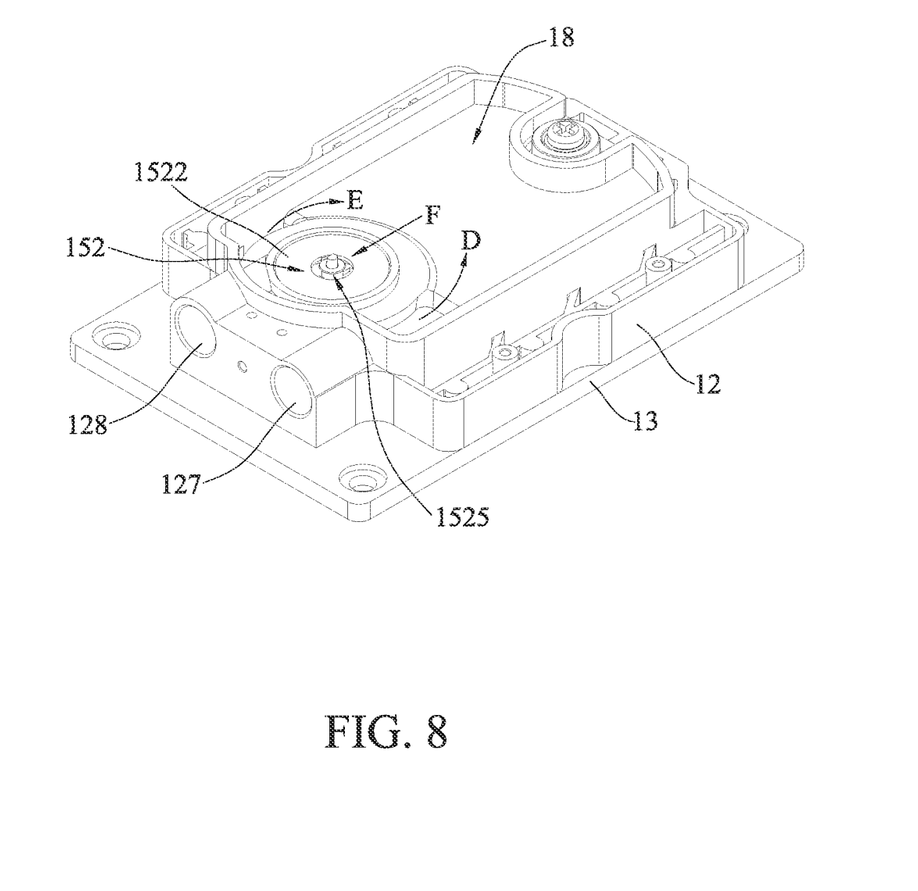
FIG. 8 is a schematic overall view of the cold plate of FIG. 1 with only the upper cover hidden.
Figure 9:
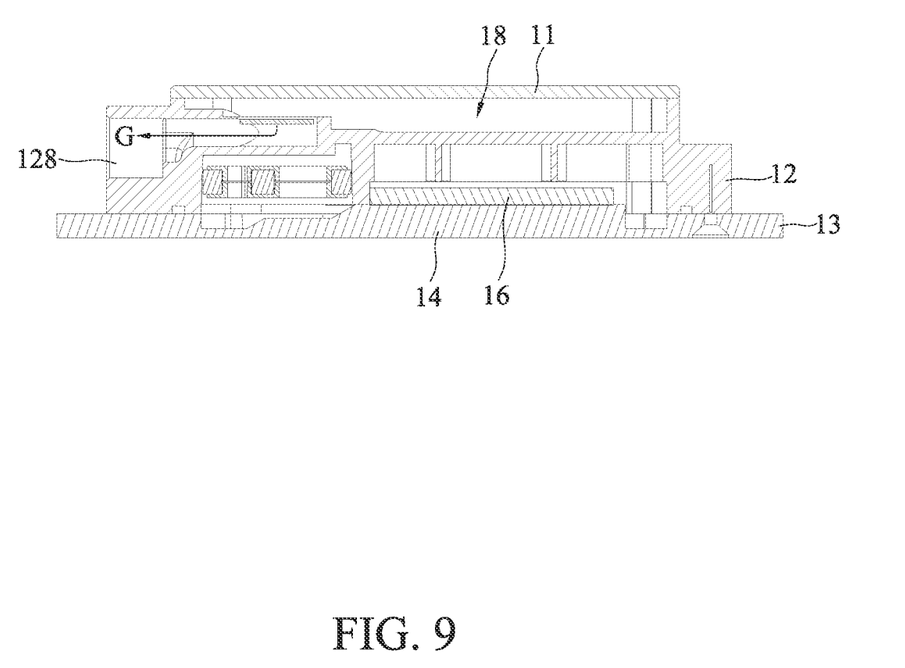
FIG. 9 is a schematic cross-sectional view of FIG. 1 along the line D-D.

A groove 131 is formed on the inner side of the base 13. The heat transfer structure 14 is disposed in the groove 131 on the inner side of the base 13, and is a plurality of fins, such as skived fins, or other columnar, sheet, or even irregular shapes of fins, but the present disclosure is not limited thereto. In one embodiment, the heat transfer structure 14 is offset from the center of the groove 131, so that the guide channel 125 is located above the heat transfer structure 14, but the guide channel 126 is not located directly above the heat transfer structure 14 (as shown in FIG. 7). The outer side of the base 13 is used to directly or indirectly contact a heat source, so the heat generated by the heat source can be transferred to the working medium in the action space 17 via a plurality of fins. In one embodiment, the material of the base 13 can be selected from metal or other materials with good thermal conductivity, and the structure of the base 13 may be an one-piece (integrated) structure, or a composite structure composed of multiple layers or multiple elements, but the present disclosure is not limited thereto. The pump 15 has a stator 151 and a rotor 152. The stator 151 is disposed in the accommodating groove 123, and the working medium can flow into the accommodating groove 123 to absorb the heat generated by the stator 151. In an embodiment, the stator 151 can contact the working medium, but the present disclosure is not limited to as such. In an embodiment, the surface of the stator 151 is coated with a protection layer (not shown), where the material of the protection layer includes an epoxy resin, a chemically plated nickel (e.g., electroless nickel), or an ultraviolet curable adhesive, but the present disclosure is not limited to as such. The rotor 152 is disposed in the drainage groove 124.

Figure 10:
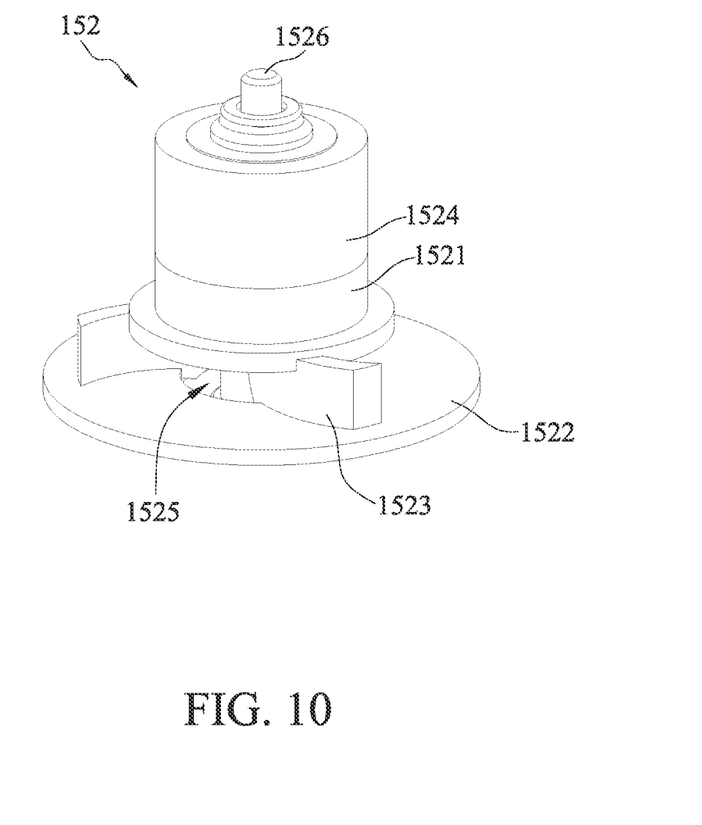
FIG. 10 is a schematic overall view of a rotor in the cold plate according to the present disclosure.

Please refer to FIG. 10, the rotor 152 has a body 1521, a bottom plate 1522, a plurality of blades 1523, a magnetic element 1524, a hollow portion 1525 and a shaft rod 1526. The shaft rod 1526 penetrates through the body 1521, and one end of the shaft rod 1526 is abutted against a bottom end of the drainage groove 124 (adjacent to the opening 1241), so that the body 1521 can rotate with the shaft rod 1526 as an axis. The bottom plate 1522 is disposed at one end of the body 1521 and located at the top of the drainage groove 124 to substantially cover the drainage groove 124. The plurality of blades 1523 extend outward from the body 1521 and are formed on the bottom plate 1522, the magnetic element 1524 is sleeved on the body 1521 and is located between the bottom plate 1522 and the bottom of the drainage groove 124, and the hollow portion 1525 is formed in the center of the bottom plate 1522. When the pump 15 is energized, under the combined action of the stator 151 and the magnetic element 1524, the body 1521 connected with the magnetic element 1524 can be driven to rotate, so that the plurality of blades 1523 can guide the working medium to generate flow.

The partition plate 16 is disposed between the casing 12 and the base 13, and is used to partition the action space 17 into a water storage space 171 and a heat absorption space 172 (as shown in FIG. 6). In detail, the partition plate 16 is, for example, a U-shaped structure, which can be clamped in the groove 131 of the base 13 and cover the heat transfer structure 14, for instance, can abut against the tops of the plurality of fins, so that the heat transfer structure 14 is located in the heat absorption space 172. In addition, the partition plate 16 and the casing 12 may jointly define a connecting channel 19, which communicates with the water storage space 171 and the heat absorption space 172 and is located on the side away from the pump 15.

In one embodiment, the heat transfer structure 14 can be located under both the partition plate 16 and the pump 15 at the same time, and its fins have different heights, and the height of the heat transfer structure 14 under the pump 15 is lower than the height of the heat transfer structure 14 under the partition plate 16, but the present disclosure is not limited thereto.

The following describes the operation of the working medium in the cold plate 1 of the present disclosure.

Please refer to FIG. 5 to FIG. 9, the working medium enters the water storage space 171 (such as arrow A) of the action space 17 via the water inlet channel 127, and then enters the heat absorption space 172 (such as arrow B) via the connecting channel 19, at this time, the working medium can be collected in the groove 131 first, and then flows into the heat transfer structure 14. After that, when the working medium flows between the plurality of fins of the heat transfer structure 14 (such as arrow C), it can absorb the heat generated by the heat source and increase its temperature.

The heated working medium can flow to the accommodating groove 123 and absorb the heat generated by the stator 151 together. Next, the working medium flows to the water collecting chamber 18 via the guide channels 125 and 126 (such as arrows D and E), and the rotor 152 is actuated to suck the working medium, for instance, from the hollow portion 1525 in the center of the bottom plate 1522 to the drainage groove 124 (such as arrow F), and then driven by the plurality of blades 1523, the working medium is sequentially thrown into the water outlet channel 128 (such as arrow G) by the action of centrifugal force, and then the working medium is discharged from the cold plate 1. The heated working medium discharged from the cold plate 1 can be cooled by a condensing device (such as a fan, a water-cooled exhaust, etc.), and the cooled working medium can enter the cold plate 1 via the water inlet channel 127 for the next heat dissipation cycle.

In summary, with the design that the stator in the cold plate of the present disclosure can contact the working medium, the overall operating temperature of the pump can be effectively reduced, thereby increasing the service life of the pump. In addition, a water storage space and a water collecting chamber are defined in the casing, which can effectively increase the water storage area of the working medium and avoid the situation that the pump cannot absorb water. In addition, the working medium after flowing through the heat transfer structure is not stored in the space at the end of the heat transfer structure, but is stored in the water collecting chamber located above the action space via the guide channel. This means that there is no need to reserve a water storage space for the pump to absorb water on the base, and the setting area of the heat transfer structure on the base can be maximized, thereby effectively improving the overall heat dissipation performance.

The foregoing embodiments are used for the purpose of illustrating the principles and effects rather than limiting the present disclosure. Anyone skilled in the art can modify and alter the above embodiments without departing from the spirit and scope of the present disclosure. Therefore, the range claimed by the present disclosure should be as described by the accompanying claims listed below.

What is claimed is:

1. A cold plate, comprising:
   a casing formed with an accommodating groove on a bottom side thereof;
   an upper cover coupled to a top side of the casing to define a water collecting chamber together with the casing;
   a base coupled to the bottom side of the casing to define an action space together with the casing, wherein the action space communicates with the accommodating groove;
   a heat transfer structure disposed on an inner side of the base for transferring a heat energy generated by a heat source in contact with an outer side of the base to a working medium in the action space; and
   a pump having a stator disposed in the accommodating groove,
   wherein the top side of the casing is formed with a drainage groove, wherein the drainage groove is communicated with the water collecting chamber, and a position of the drainage groove corresponds to a position of the accommodating groove, and wherein the pump further has a rotor disposed in the drainage groove.

2. The cold plate of claim 1, wherein the casing further has at least one guide channel, and wherein the guide channel penetrates through the top side and the bottom side of the casing and is spaced from the accommodating groove or the drainage groove to communicate with the water collecting chamber and the action space.

3. The cold plate of claim 2, wherein a number of the guide channels is two, and one of the guide channels is located above the heat transfer structure.

4. The cold plate of claim 1, wherein the casing further has a water inlet channel communicating with the action space and a water outlet channel communicating with the drainage groove.

5. The cold plate of claim 1, wherein a bottom of the drainage groove has an opening communicating with the action space.

6. The cold plate of claim 1, wherein the rotor has a body, a bottom plate and a magnetic element, wherein the bottom plate is disposed on one end of the body and located at a top of the drainage groove, and wherein the magnetic element is sleeved on the body and located between the bottom plate and a bottom of the drainage groove.

7. The cold plate of claim 1, further comprising a partition plate disposed between the casing and the base to partition the action space into a water storage space and a heat absorption space, wherein the partition plate and the casing jointly define a connecting channel communicating with the water storage space and the heat absorption space.

8. The cold plate of claim 7, wherein the heat transfer structure is a plurality of fins located in the heat absorption space, and wherein the partition plate is abutted against tops of the plurality of fins.

9. The cold plate of claim 7, wherein the heat transfer structure is located under the partition plate and the pump at a same time, and a height of the heat transfer structure located under the pump is lower than a height of the heat transfer structure located under the partition plate.

10. The cold plate of claim 1, wherein the stator is in contact with the working medium.

11. The cold plate of claim 10, wherein a surface of the stator is coated with a protection layer.

12. The cold plate of claim 11, wherein a material of the protection layer includes an epoxy resin, an electroless nickel, or an ultraviolet curable adhesive.

* * * * *